United States Patent

Ishikawa et al.

[11] 4,160,964
[45] Jul. 10, 1979

[54] HIGH FREQUENCY WIDE BAND RESONANT CIRCUIT

[75] Inventors: Fumio Ishikawa, Isehara; Yukio Tsuda, Machida, both of Japan

[73] Assignee: Sony Corporation, Tokyo, Japan

[21] Appl. No.: 816,200

[22] Filed: Jul. 15, 1977

[30] Foreign Application Priority Data

Jul. 22, 1976 [JP] Japan .................. 51/87518

[51] Int. Cl.² ............................... H03J 3/18
[52] U.S. Cl. .................. 334/15; 331/177 V
[58] Field of Search .............. 330/305; 334/15; 331/36 C, 177 V; 325/383, 422, 453, 454, 462, 463, 464; 332/30 V; 307/320

[56] References Cited

U.S. PATENT DOCUMENTS

| | | | |
|---|---|---|---|
| 3,067,394 | 12/1962 | Zimmermann et al. | 307/320 X |
| 3,249,897 | 5/1966 | Trilling | 307/320 X |
| 3,400,338 | 9/1968 | Ishman | 331/177 V X |
| 3,569,850 | 3/1971 | Wegener et al. | 330/56 |
| 3,581,239 | 5/1971 | Knutson | 307/320 X |
| 3,899,755 | 8/1975 | Uchida | 334/15 X |
| 3,980,957 | 9/1976 | Putzer | 334/15 X |

FOREIGN PATENT DOCUMENTS 2251388  5/1973  Fed. Rep. of Germany ........... 307/320

*Primary Examiner*—Paul L. Gensler
*Attorney, Agent, or Firm*—Lewis H. Eslinger; Alvin Sinderbrand

[57] ABSTRACT

A high frequency wide band resonant circuit is formed of a lump capacitor, a lump inductor and a voltage controlled variable capacitor. The resonant circuit is suitable to be used in a receiving circuit which selectively receives a signal in the UHF band.

1 Claim, 4 Drawing Figures

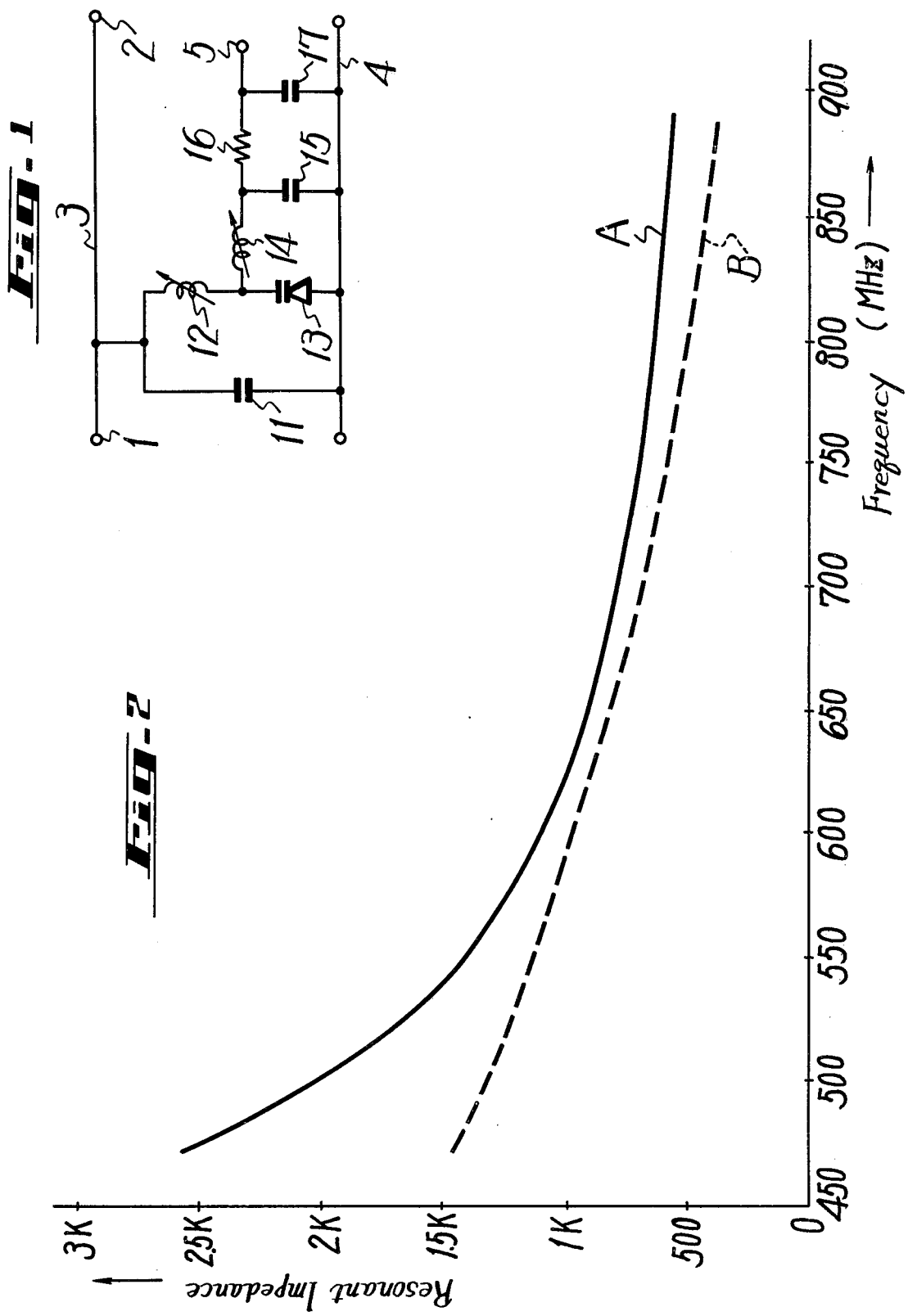

HIGH FREQUENCY WIDE BAND RESONANT CIRCUIT

BACKGROUND OF THE INVENTION

1. Field of the Invention

This invention relates generally to a resonant circuit and is directed more particularly to a high frequency wide band resonant circuit which is formed without using a distributed element and hence which can be easily made compact or small in size.

2. Description of the Prior Art

In order to select the signal received by a tuner of a receiver for a high frequency and wide band signal, for example, a UHF band television signal, a resonant circuit which uses a voltage controlled variable capacitance diode and a distributed element has been employed in many cases as disclosed in, for example, the U.S. Pat. No. 3,569,850.

In the prior art, the shape of the distributed element used in the resonant circuit is determined in compliance with the wave length at the resonant frequency, so that it is difficult to make the element compact. Further, since the distributed element is easily influenced by its environment and hence housed in a shielding case, it occupies a rather large space and its adjustment is difficult to be done. In addition, the inductance value of the distributed element is varied much by the resonant frequency which variation acts to cancel capacitance variation of the variable capacitance diode, so that a greater range of capacitance of the variable capacitance diode is required for a variation range of the resonant frequency than if the inductance of the distributed element were constant.

Further the voltage controlled variable capacitance diode is generally low in the quality factor Q and, in a UHF band, its resonant impedance becomes substantially equal to the impedance of an active element to which a resonant circuit containing the voltage controlled variable capacitance diode is connected (for example, the impedance between the gate and drain of an FET, and impedance between the base and collector of a bipolar transistor), so that signal transmission loss becomes great. Therefore, in the case where the voltage controlled variable capacitance diode is used in a tuner of a receiver for UHF band signals, it would be desirable to reduce the signal transmission loss as much as possible throughout the frequency band of the received signals.

OBJECTS AND SUMMARY OF THE INVENTION

Accordingly, it is an object of the present invention to provide an improved high frequency wide band resonant circuit.

It is another object of the invention to provide a high frequency wide band resonant circuit which does not use any distributed elements thus can be easily formed compact in size.

It is a further object of the invention to provide a high frequency wide band resonant circuit using a voltage controlled variable capacitance element which is small in size and having less signal transmission loss.

According to an aspect of the present invention there is provided a high frequency wide band resonant circuit which comprises a first lump capacitive element, and a parallel series circuit consisting of a lump inductive element and a voltage controlled variable capacitance element. Connected in parallel to the voltage controlled variable capacitance element is a second series circuit consisting of a second lump inductive element and a second lump capacitive element for supplying the control voltage to the voltage controlled variable capacitance element through the second lump inductive element and across the second capacitive element. The preferred embodiment further comprises a resistor with one end connected to the connection point between the second inductive element and the second capacitive element to supply therethrough the control voltage to the variable capacitance element and may still further comprise another capacitor connected to the other end of the resistor and in parallel with the second lump capacitive element to form a II circuit.

The other objects, features and advantages of the present invention will become apparent from the following description taken in conjunction with the accompanying drawings.

BRIEF DESCRIPTION OF THE DRAWING

FIG. 1 is a connection diagram showing an example of a high frequency wide band resonant circuit according to the present invention; and FIGS. 2, 3 and 4 are graphs showing different characteristics of the example of the invention shown in FIG. 1, respectively, which are used for explaining the operation of the example.

DESCRIPTION OF THE PREFERRED EMBODIMENT

Figure 3:
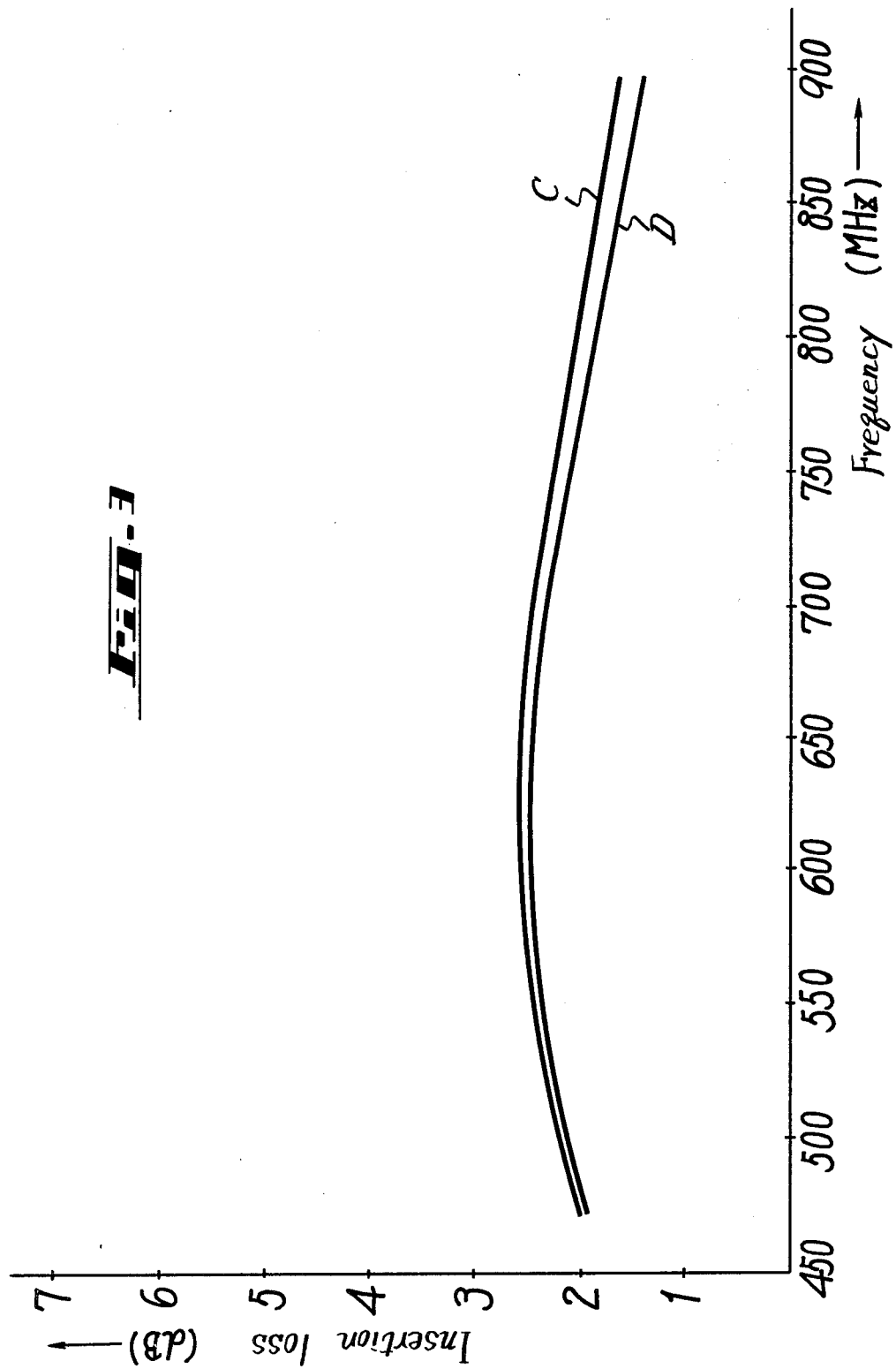

An example of the high frequency wide band resonant circuit according to the present invention will be hereinafter described with reference to FIG. 1 which is a connection diagram of the high frequency wide band resonant circuit used in a tuner of a television receiver which may receive a television signal of a UHF band of, for example, 473 MH$_z$ to 767 MH$_z$ in Japan.

In FIG. 1, 1 designates an input terminal and 2 an output terminal, respectively. The input and output terminals 1 and 2 are coupled by a signal line 3. Between the signal line 3 and a common line 4 a capacitor, for example, lump capacitor 11 whose capacitance is selected about 3 to 6 pF is connected. A series circuit consisting of a coil, for example, lump adjustable inductor 12, whose inductance is selected with a range about 21 to 28 nH, and a variable capacitance diode 13, whose capacitance is varied within the range of 2.2 to 15 pF is connected in parallel to the capacitor 11. Further, a series circuit consisting of a coil (lump adjustable inductor) 14, whose inductance is selected with a range about 48 to 56 nH and a lump capacitor 15 whose capacitance is selected about 10 to 40 pF is connected in parallel to the variable capacitance diode 13. The capacitor 15 is connected, in parallel, with a series circuit consisting of a resistor 16 whose resistance is selected about 30 to 300Ω and a capacitor 17. From the connection point between the resistor 16 and the capacitor 17 there is led out a control voltage supply terminal 5 which is supplied with a control voltage to control the capacitance value of the variable capacitance diode 13.

In the above construction, the capacitor 11, coil 12 and diode 13 form a resonant circuit in which the capacitance value of the variable capacitance diode 13 is varied by the control voltage through the terminal 5 and hence the resonant frequency of the resonant circuit is varied. Further, in this construction the coil 14 is connected to the diode 13 in parallel, so that the apparent capacitance value of the diode 13 is lowered and its variation rate can be made great with the result that the variation range of the resonant frequency can be widened.

Generally speaking, in a circuit as described above, a parasitic resonance may be caused at a frequency, for example, of one-half of a desired resonance frequency. Therefore, in the resonant circuit of the invention shown in FIG. 1, a $\pi$-shape circuit formed of the capacitors 15, 17 and resistor 16 is provided and the impedances of the respective elements forming the $\pi$-shape circuit are selected so as to satisfy the following condition in the parasitic resonant frequency band:

$$|Z_{17}| < < R_{16}$$

$$|Z_{14}| \simeq |Z_{15}| \simeq R_{16}$$

where $Z_{14}$, $Z_{15}$, $R_{16}$ and $Z_{17}$ represent the impedance values of the coil 14, capacitor 15, resistor 16 and capacitor 17, respectively. Thus, the apparent impedance value of the coil 14 connected in parallel to the diode 13 can be made small in the desired frequency band but great in the parasitic frequency band with the result that the quality factor Q of the resonant circuit becomes small and the signal transmission loss great in the parasitic frequency band.

Thus, the wide band resonant circuit is constructed. In the resonant circuit of the invention no distributed element is used, so that there is no need to employ a shielding case, a specific substrate and so on. The resonant circuit thus can be formed in limited space on the same substrate as other circuits. Accordingly, the whole circuit becomes simple in construction and can be made compact or small in size. Further, there is no partition wall such as a shielding plate and so on between the resonant circuit and the other circuits, so that adjustment of the resonant circuit becomes easy and the coupling degree between sequential stages can be selected freely. Therefore, the resonant circuit can be easily adjusted or compensated for non-uniformity in the characteristics of the circuit elements.

In the example of FIG. 1, the coils 12, 14, the capacitors 11, 15 and other elements have inductance or capacitance impedance values which are not changed at different resonant frequencies, namely, lump elements. Accordingly, the resonant frequency of the resonant circuit responds to only the capacitance of the diode 13 and there is no element such as a distributed one to cancel or limit the capacitance variation. The variation range of the resonant frequency thus can be made wide.

Further, since the quality factor Q of the resonant circuit is low in the parasitic resonant frequency band, a signal in the parasitic resonant frequency band is not amplified to deteriorate the tuning characteristic and cause a parasitic oscillation.

Further, with the resonant circuit of the invention the insertion loss can be made constant over a wide band. That is, generally speaking, the insertion loss of a resonant circuit is expressed by $$10 \log Z_o/Z_o+Z_d)$$

where $Z_o$ is the resonant impedance of the resonant circuit and $Z_d$ is the input impedance of the circuit of the following stage.

With the resonant circuit of the invention, its resonant impedance $Z_o$ is changed along a solid line curve A in the graph of FIG. 2, in which the ordinate represents the impedance value and the abscissa the frequency in MHz. The input impedance of an FET in a source configuration or bipolar transistor is generally changed along a dotted line curve B in FIG. 2. As may be apparent from FIG. 2, the curves A and B are similar with each other, so if a high frequency selective amplifier circuit or a high frequency oscillation circuit (not shown) is formed by combining the resonant circuit of the invention with an FET or bipolar transistor having the general impedance characteristic shown in FIG. 2, curve B, its insertion loss can be made approximately constant as shown by curves C and D in the graph of FIG. 3, in which the ordinate represents the insertion loss in dB and the abscissa the resonant frequency in MHz, irrespective of the resonant frequency. In FIG. 3, the curve C shows the case where the inductance connecting an input lead wire of the FET or bipolar transistor to which the resonant circuit is connected is 3 nH and the curve D shows the case where it is 5 nH, respectively.

Accordingly, if the resonant circuit of the invention is used as a tuning circuit for a high frequency amplifier, the noise figure of the high frequency amplifier can be made constant over a wide frequency range, while if the resonant circuit of the invention is used in an oscillation circuit, it can be oscillated stably over a wide frequency range.

Figure 4:
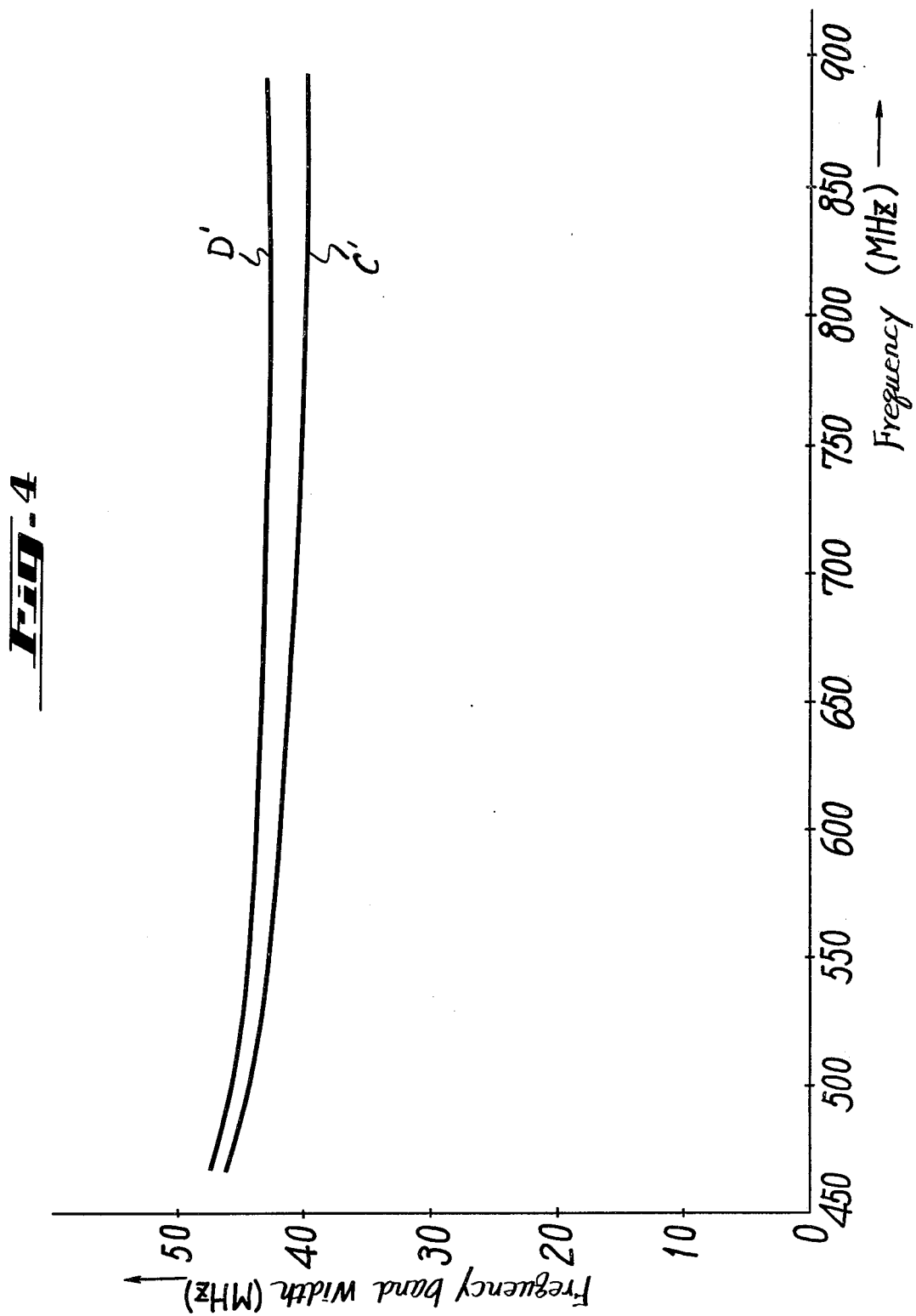

Further, with the resonant circuit of the present invention, the coil 14 makes the pass band width of the circuit at resonance approximately constant regardless of the resonant frequency as shown by curves C' and D' in the graph of FIG. 4 in which the ordinate represents the band width in MHz and the abscissa the resonant frequency in MHz. The graph of FIG. 4 shows the case where the resonant circuit is used as an input tuning circuit for an FET or bipolar transistor amplifier (not shown) and the inductance of an input lead wire of the FET or bipolar transistor is selected to be 3 nH for the curve C' and 5 nH for the curve D', respectively.

Accordingly, if the resonant circuit of the invention is used as a tuning circuit, an optimum pass band can be obtained all over the tuning range with the result that a signal at an adjacent channel, or an image signal mixed into the desired signal, or a local oscillation output signal leaked to the input terminal of the circuit can be reduced.

In the resonant circuit of the invention, the coil 14 is connected in parallel to the diode 13 to lower the apparent capacitance of the latter, but the rate of change of the apparent capacitance of the diode 13 is less in the low frequency range. Thus, in the setting of the control voltage for the diode 13, even if the lowest frequency of the resonance is adjusted by the coil 12 and thereafter the highest frequency of the resonance is adjusted by the coil 14, the lowest frequency which was adjusted previously is not changed. That is, the lowest and highest frequencies of the resonance can be adjusted independently, so that the adjustment becomes easy and the control voltage for the diode 13 can be set at a desired value accurately.

With the resonant circuit of the invention, due to the provision of the coil 14 a resistor used for biasing the diode 13 in the known art can be eliminated, so that the resistive element provided between the diode 13 and control voltage supply terminal 5 is only the resistor 16 which has a low resistance value. Therefore, even when an input signal of high level is supplied to the input terminal 1, the control voltage is not fluctuated by the input signal and hence the resonant circuit of the invention can perform stable operation under the application of the input signal of high level.

As described above, according to the present invention a high frequency wide band resonant circuit which is small in size and stable in operation can be obtained. The resonant circuit of the invention is especially preferred for use with a UHF television receiver of a small size but can be used in larger receivers or other receivers which will receive a signal of a VHF band.

The above description is given on a single preferred embodiment of the present invention but it will be apparent that many modifications and variations could be effected by one skilled in the art without departing from the spirit or scope of the novel concepts of the invention. Therefore, the scope of the invention should be determined by the appended claims only.

We claim as our invention:

1. A high frequency wide band resonant circuit comprising:
   a first capacitive element;
   a first series circuit including a first inductive element and a voltage controlled variable capacitance element and being connected in parallel to said first capacitive element;
   a second series circuit including a second inductive element and a second capacitive element, said second series circuit being connected in parallel to said variable capacitance element with an end of said second inductive element connected to said first series circuit between said first inductive element and said variable capacitance element and an end of said second capacitive element being connected to a junction of said variable capacitance element with said first capacitive element;
   means for supplying a control voltage for said variable capacitance element across said second capacitive element;
   a resistor having one end connected between the junction of said second inductive element with said second capacitive element, and the other end of said resistor being connected to said means for supplying a control voltage; and
   a third capacitive element connected in series with said resistor across said second capacitive element for forming a $\pi$-type-circuit in cooperation with said resistor and said capacitive element and thereby raising the apparent impedance of said second inductive element in a frequency band likely to contain undesirable parasitic resonance and thereby reduce said parasitic resonance.

* * * * *